(12) United States Patent
Washburn (10) Patent No.: US 6,606,007 B1
(45) Date of Patent: Aug. 12, 2003

(54) CRYSTAL OSCILLATOR WITH MINIMIZED Q REDUCTION

(75) Inventor: Clyde Washburn, Victor, NY (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/919,222

(22) Filed: Jul. 31, 2001

(51) Int. Cl.[7] .................................................. H03B 5/32
(52) U.S. Cl. ................... 331/116 R; 331/132; 331/158; 331/160; 331/167
(58) Field of Search .............................. 331/116 R, 167, 331/117 EE, 117 R, 109, 182, 183, 177 R, 132, 158, 160, 175, 176, 116 FE, 108 C, 115

(56) References Cited

U.S. PATENT DOCUMENTS

| | | | |
|---|---|---|---|
| 5,150,081 A | | 9/1992 | Goldberg .................... 331/109 |
| 5,663,690 A | * | 9/1997 | McGinn ..................... 331/109 |
| 5,763,922 A | | 6/1998 | Chau |
| 6,110,842 A | | 8/2000 | Okuno et al. |
| 6,111,473 A | * | 8/2000 | Van Den Homberg . 331/116 FE |

* cited by examiner

*Primary Examiner*—Robert Pascal
*Assistant Examiner*—Kimberly E Glenn
(74) *Attorney, Agent, or Firm*—Conley, Rose & Tayon (57) ABSTRACT

A circuit and method are disclosed herein for a crystal oscillator, wherein the Q of the resonant network is not reduced through the loading effects of the oscillator's resistive bias network. The oscillator is configured as an operational transconductance amplifier (OTA) coupled to the resonant network. The OTA creates a negative resistance, which compensates for energy lost to resistance within the resonant network, thereby sustaining oscillation at the resonant frequency. Instead of using bias resistors to set and maintain the operating point of the oscillator, another OTA (with a high output impedance) injects a current into the resonant network to bias the oscillator. Advantageously, this technique avoids the reduction in Q that occurs when bias resistors are connected across the high effective parallel resistance of the resonant crystal. The higher Q benefits frequency stability and phase jitter characteristics of the oscillator.

13 Claims, 9 Drawing Sheets

CRYSTAL OSCILLATOR WITH MINIMIZED Q REDUCTION

BACKGROUND OF THE INVENTION

1. Field of the Invention

This invention relates to electronic oscillators, and more particularly to a circuit and method for a quartz crystal oscillator. Described herein are means for limiting loading effects in a crystal oscillator, thereby improving the crystal resonator quality factor (or Q). This is advantageous, since a higher Q is generally associated with improved frequency stability and lower phase jitter. Such precision oscillators are widely used as timing sources in various digital integrated circuits.

2. Description of the Related Art

Modern high-speed digital systems typically employ clock-based timing circuitry. A clock is commonly used to supply a timing reference to synchronize the state changes in logic devices, such as counters, flip-flops, etc. More complex integrated circuits (ICs), such as microprocessors, typically include clock circuitry internal to the IC for this purpose. A clock circuit is a form of electronic oscillator—i.e., a circuit that generates a periodic time-varying output. The most important characteristic for an oscillator used in a clock circuit is that the frequency of oscillation be very consistent, both on a long term and a short term basis. If the frequency of an oscillator changes slowly over time, as a result of temperature, aging effects, etc, the oscillator is said to "drift." In many applications, especially those in which the oscillator is being used for timing purposes, drift is extremely undesirable. For this reason, oscillators are often made to operate within an oven, so that variations in the ambient temperature can be avoided. Short term fluctuations in the operating frequency are usually characterized as "phase jitter," since they may occur within a span of a few cycles and may be modeled as a noise source interfering with an ideal oscillator.

Figure 1:
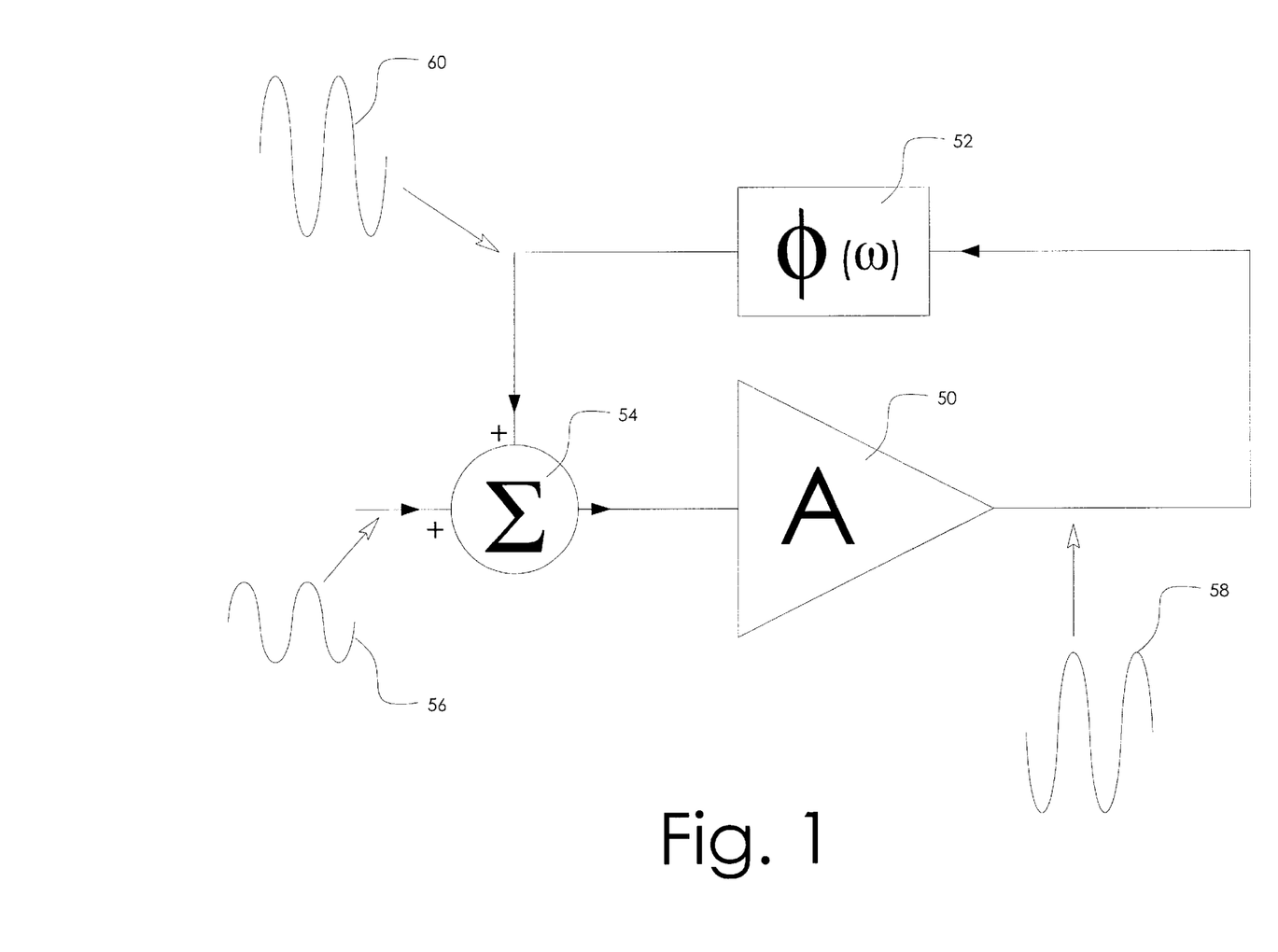
FIG. 1 contains a block diagram illustrating the operation of an oscillator.

Oscillators depend on the use of regenerative feedback from the output of the oscillator back to its input. In this context, the term "regenerative" refers to the fact that the magnitude and phase of the feedback signal are such that it reinforces the input signal, thereby sustaining oscillation. This principle is illustrated in FIG. 1. In the elementary oscillator represented in FIG. 1, an amplifier 50 increases the magnitude of any signal present at its input by a gain factor A. A phase shift network 52 phase-shifts the signal at the output of the amplifier by an angle dependent on the frequency $\phi(\omega)$ of the signal. A summing junction 54 combines the input signal with the phase-shifted, amplified version of the input signal (i.e., the feedback signal), and couples the composite signal into the amplifier 50.

The phase shift network 52 in any oscillator contains reactive components (i.e., capacitors and/or inductors), to achieve a frequency dependent phase shift. Reactive components are fundamentally different from resistive components, since they can store (but not dissipate) energy. Resistive components, on the other hand, cannot store energy and dissipate electrical energy in the form of heat. Furthermore, the voltage across an inductor or capacitor leads or lags the current through the inductor or capacitor by $\pi/2$ radians (or, equivalently, 90°), respectively. In contrast, the voltage across a resistor is always in phase with the current. The ratio of voltage across an inductor or capacitor to the current through the inductor or capacitor is known as the inductive or capacitive reactance, respectively. By the same token, the ratio of the voltage to the current in a resistor defines its resistance. In general, for a network containing a combination of resistance and capacitive or inductive reactance, the ratio of voltage to current is known as the impedance.

In a system such as that represented in FIG. 1, oscillation may be induced by an externally applied signal, or by noise, which is always present in an electronic circuit. Noise arising from random physical processes (e.g., thermally-induced molecular motion) is comprised of an entire band of frequencies. A small signal 56 represents one of the frequency components associated with random noise at the input of the summing junction 54. The random signal 56 passes through amplifier 50, emerging at the output 58 with increased amplitude and a different phase angle. Note that the phase relationship between the input signal 56 and the amplified signal 58 is not conducive to sustained oscillation. Whereas the input signal 56 is initially increasing, the amplified version 58 is decreasing. Consequently, if these signals were combined in the summing junction 54, the noise signal 56 would not be reinforced by the feedback signal 58. However, the effect of the phase shift network 52 is to further alter the phase angle of the amplifier output, producing a signal 60 that has the same phase angle as the initial random signal 56. When the in-phase, amplified signal 60 is combined with the input signal 56 in the summing junction 54, it reinforces the input signal. Under these circumstances, the oscillator will generate the signal continuously.

For continuous oscillation to occur, an oscillator must provide a phase shift of $2\pi$ radians (or, equivalently, 360°) at the frequency of oscillation. The phase shift is necessary to reinforce the input signal, as described above. As mentioned earlier, the phase angle associated with phase shift network 52 is frequency dependent. Thus, there is just one (fundamental) frequency at which the phase angle of the feedback signal will be $2\pi$ radians, and the oscillator operates at only this frequency. In practice, the frequency of an oscillator can be made adjustable, by incorporating variable reactive components in the phase shift network. In addition to the necessary phase shift, the oscillator must also have sufficient gain to overcome losses in the resistive components of the oscillator. Without the gain provided by the amplifier, these losses would eventually attenuate the oscillatory signal.

There are a variety of ways to create a oscillator. A classic approach, known as an RC ring oscillator, consists of series-connected phase shift stages, in which the combined phase shift is sufficient to achieve oscillation at the desired operating frequency. For example, an RC ring oscillator can be formed by connecting four stages in series, each stage having a phase shift of $\pi/2$ radians at the desired frequency. By connecting the output of the fourth stage to the input of the first, an overall phase shift of $2\pi$ radians results. If there is sufficient gain, the RC ring oscillator will sustain oscillation. Although this technique is straightforward, it tends to be noisy and lacks sufficient frequency stability for many applications.

A better approach, the LC oscillator, uses both inductors and capacitors in the phase shift network to obtain the necessary $2\pi$ radians of phase shift. ("LC" oscillators are so named because the traditional symbols for inductance and capacitance are L and C, respectively).

Inductors and capacitors are complementary. Inductive reactance is positive, while capacitive reactance is negative. Moreover, inductive reactance increases in magnitude with frequency, while capacitive reactance decreases. The impedance of a circuit comprising a series combination of an inductor and capacitor is given by:

$$Z(\omega) = j\omega \cdot L - \frac{j}{\omega \cdot C}$$

where Z is impedance (in ohms), L is inductance (in Henries), C is capacitance (in Farads), and ω is frequency (in radians per second). Note that Z(ω) becomes zero when $\omega^2 LC=1$.

$$\omega_0 = \frac{1}{\sqrt{L \cdot C}}$$

The frequency $\omega_0$ at which this occurs is known as the resonant frequency for the given LC pair, and the resonant LC network is referred to as a "tank" circuit. Equivalently, the resonant frequency is defined as the frequency at which the inductive and capacitive reactances cancel. A tank circuit operating at its resonant frequency is said to be "resonating" or "at resonance."

At the resonant frequency the impedance of the LC network becomes real (since, at resonance, the inductive and capacitive reactance become equal in magnitude and opposite in sign, and therefore, cancel). An LC oscillator will preferentially oscillate at the resonant frequency of its LC network. When operated at its natural resonant frequency, the frequency stability of a properly designed LC oscillator is inherently better than that of oscillators based on RC phase shift networks.

Figure 2A:
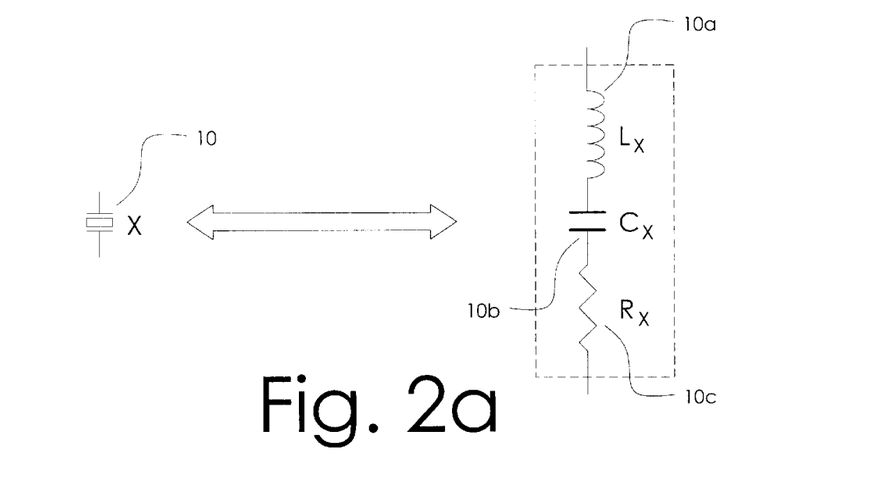
FIGS. 2a and 2b present the equivalent circuit for a crystal and a schematic diagram of a typical crystal oscillator, respectively.

A quartz crystal is an electromechanical device that behaves like a resonant inductor-capacitor combination in an oscillator. A quartz crystal is often represented by an equivalent circuit consisting of an inductor, a capacitor and a resistor connected in series, as shown in FIG. 2a. As mentioned earlier, the frequency of oscillation in an LCR oscillator is determined by the phase shift due to the reactive components in the LCR network—i.e., the inductor and capacitor. The network shown to the right in FIG. 2a is commonly referred to as a series LCR (i.e., inductance-capacitance-resistance) circuit. The effective values of the reactive components (i.e., the inductor and capacitor) can be much different in magnitude than is achievable with discrete inductors and capacitors. Therefore, crystals are desirable for use in high-frequency oscillators. For example, a crystal 10 with a 25 MHz resonant frequency is equivalent to an inductance 10a of 2.9 mH, in series with a capacitance 10b of 14 fF and a resistance 10c of 10 Ω. In addition, the effective inductance and capacitance of a crystal are quite stable, minimizing variations in the resonant frequency of the crystal over time and with changes in temperature. Because of their stability and their suitability for use at high frequencies, crystals are the preferred resonant component for the oscillators employed in digital systems.

In the equivalent circuit for crystal 10, the inductive reactance $L_X$ 10a typically equals the capacitive reactance $C_X$ 10b. In other words, at frequencies of interest, the crystal appears series resonant. For practical considerations relating to oscillator design, most crystal oscillators do not operate the crystal at its intrinsic resonant frequency, but instead resonate the crystal in combination with a parallel capacitor.

As stated earlier, reactive components do not dissipate power. Consequently, once oscillation is started in an LC circuit consisting of an ideal inductor and capacitor, it will continue indefinitely. Real components, of course, always contain some resistance (shown as resistor $R_X$ 10c in FIG. 2a). Accordingly, a figure of merit known as the "Q" or "quality factor," is often used to characterize a resonant LCR network (or a crystal). The Q is defined to be the ratio of the energy stored in the LCR network to the energy dissipated, during one cycle at a given frequency. This criterion is roughly equivalent to evaluating how closely the LCR network approximates an ideal LC (i.e., lossless) network. Thus, a crystal with a high Q (e.g., Q>50,000) loses very little energy to intrinsic resistance.

In a practical oscillator, energy must constantly be supplied to compensate for losses in non-ideal components, or oscillation will eventually cease. This energy is supplied by the amplifier within the oscillator. In fact, the amplifier within an oscillator creates a negative resistance, overcoming the losses due to resistance within the non-ideal resonant network. This provides an alternative model to that shown in FIG. 1, which is particularly useful for designing crystal oscillators.

Figure 2B:
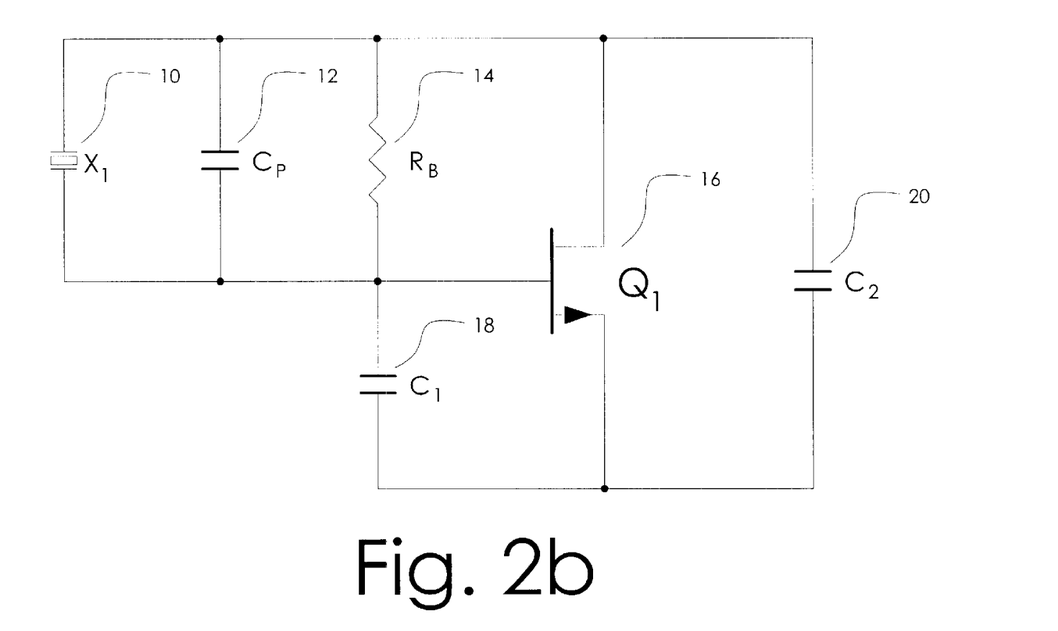

FIG. 2b illustrates a simple oscillator employing a resonant network consisting of crystal $X_1$ 10, together with a parallel capacitance $C_P$ 12. Also connected in parallel with the crystal is a bias resistor $R_B$ 14. A transistor $Q_1$ 16 serves as the amplifier for the oscillator, and supplies power dissipated in the resistance of the crystal. A capacitor $C_1$ 18 is connected from the gate to the source of transistor $Q_1$ 16, and another capacitor $C_2$ 20 is connected from the drain to the source. The function of these capacitors is described below.

Figure 3:
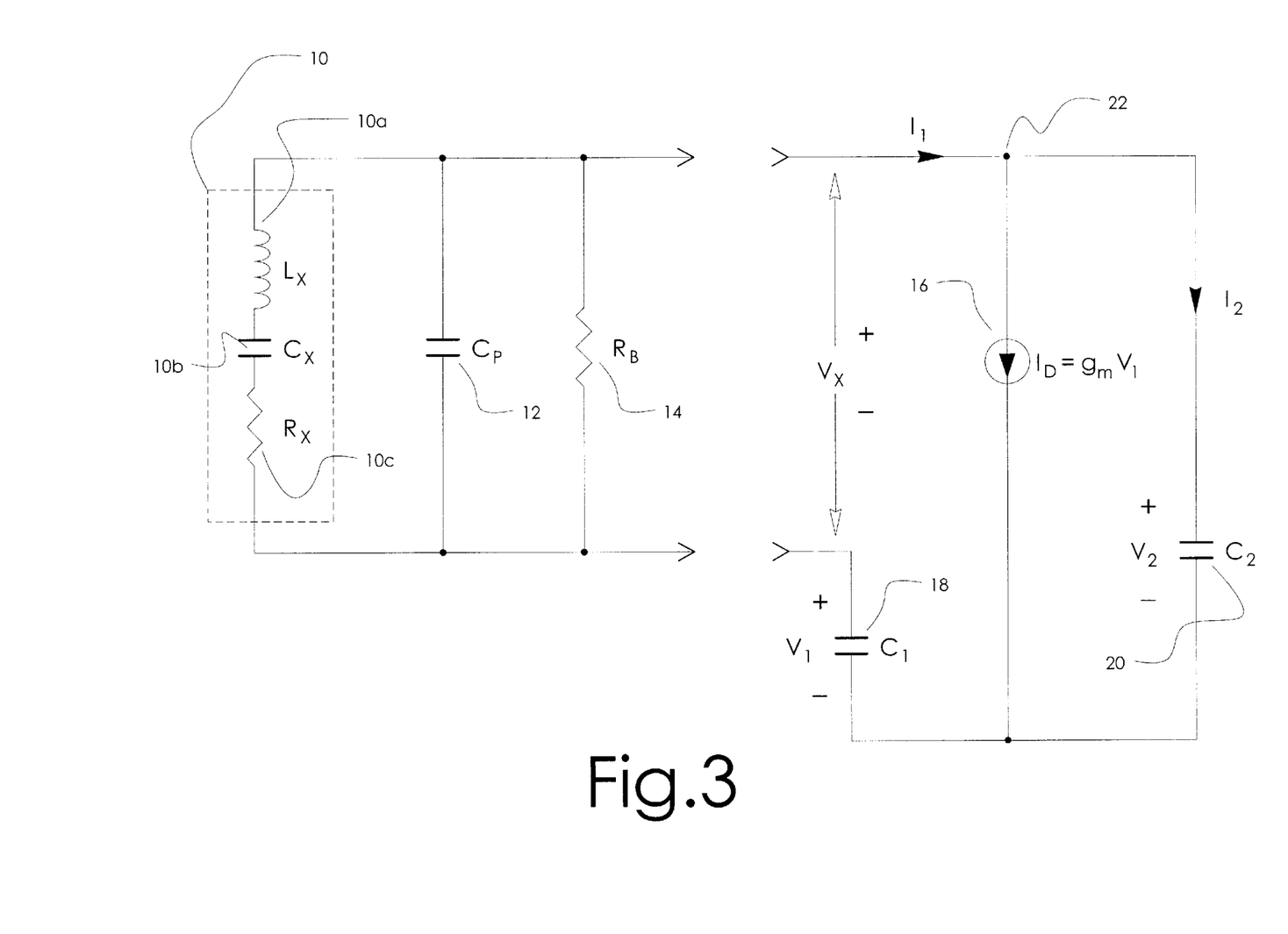
FIG. 3 contains an equivalent circuit for a simple crystal oscillator.

FIG. 3 contains an equivalent circuit for the oscillator of FIG. 2b. The circuit is divided, with the components on the right representing transistor $Q_1$ 16 and capacitors $C_1$ 18 and $C_2$ 20. The components on the left represent the crystal $X_1$ 10 (within the dashed lines), parallel capacitor $C_P$ 12, and bias resistor $R_B$ 14. This division will be used to analyze the impedance presented by $Q_1$, $C_1$ and $C_2$ to the resonant network ($X_1$, $C_P$ and $R_B$) on the left. In the network on the right, $V_X$ represents the voltage across the crystal (which is also the gate-to-drain voltage of transistor $Q_1$). $V_1$ and $V_2$ are the voltage across $C_1$ and $C_2$, respectively. Note that $V_1$ is also the gate-to-source voltage of transistor Q1. A loop current $I_1$ enters node 22, and a second loop current $I_2$ enters capacitor $C_2$ 20. The drain current $I_D$ in transistor Q1 is represented by a voltage dependent current source 16, the magnitude of which is the product of the transconductance of $Q_1$ with the gate-to-source voltage of $Q_1$:

The voltages around the network must add to zero: $V_2 = V_x + V_1$

Voltages $V_1$ and $V_2$ are developed by the current $I_1$ through capacitor $C_1$, and $I_2$ through $C_2$, respectively. These relationships may be expressed in the complex frequency domain :

$$V_1 = \frac{-I_1}{sC_1} \text{ and } V_2 = \frac{I_2}{sC_2}$$

Finally, the current $I_2$ can be defined in terms of $I_1$ and the transistor drain current $I_D$:

$$I_2 = I_1 - I_D = I_1 - g_m \cdot V_1$$

The above equations can be solved for $V_X$ in terms of $I_1$ and the fixed component values:

$$V_x = I_1 \cdot \left[ \frac{1}{sC_1} + \frac{1}{sC_2} + \frac{g_m}{s^2 C_1 C_2} \right]$$

Dividing both sides of the above equation by $I_1$ yields the impedance seen by the resonant network ($X_1$ 10, $C_P$ 12, and $R_B$ 14 in FIG. 3). In the continuous frequency domain, the expression for the impedance is obtained by substituting s=jω:

$$Z = \frac{V_x}{I_1} = \frac{1}{j\omega C_1} + \frac{1}{j\omega C_2} - \frac{g_m}{\omega^2 C_1 C_2}$$

The rightmost term in the above expression is significant. It is a negative real quantity, and therefore, represents a negative resistance. While a conventional resistor dissipates energy, a negative resistor is an energy source. The negative resistance attributed to $Q_1$, together with $C_1$ and $C_2$, sustains oscillation by replacing the energy in the crystal that would otherwise be lost in the non-ideal components of the resonant network. In fact, the circuit represented in FIG. 3 will oscillate as long as:

$$R_x < \frac{g_m}{\omega^2 C_1 C_2}$$

in other words, as long as the magnitude of the negative resistance is greater than that of the intrinsic resistance of the crystal.

Figure 4A:
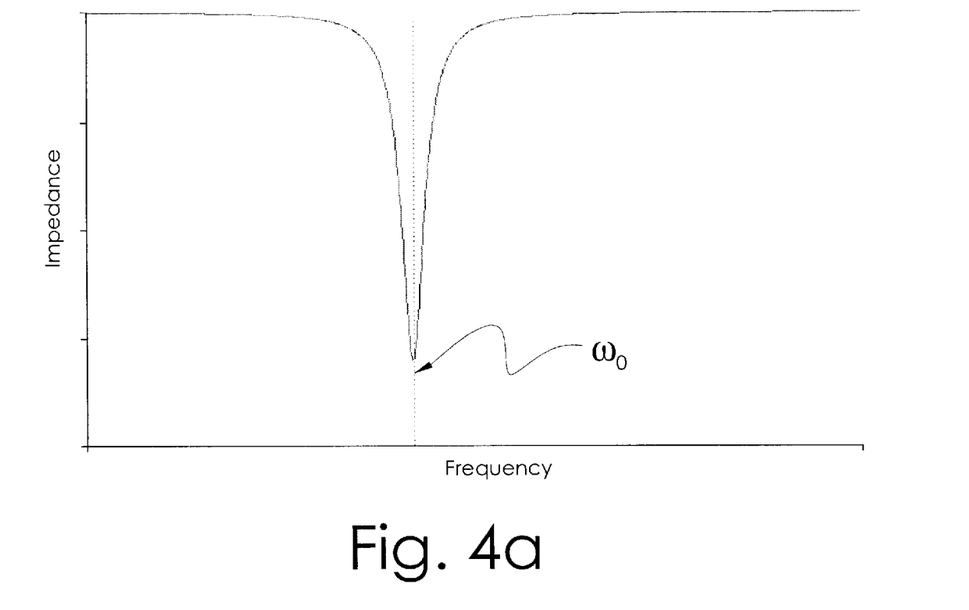
FIG. 4 plots the magnitude and phase of the impedance of a series LCR network with a low intrinsic resistance.
Figure 4B:
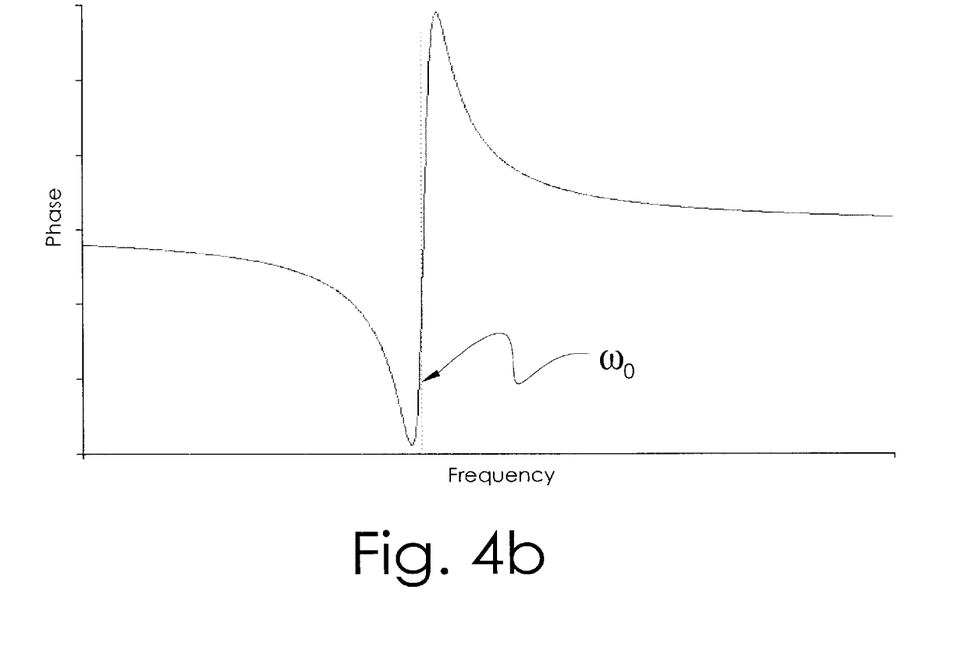

In addition to energy loss, the intrinsic resistance in a crystal degrades its performance in another way. The impedance of a series LCR circuit is frequency dependent, attaining a minimum value at the resonant frequency. FIGS. 4a and 4b contain magnitude and phase plots, respectively, of the impedance of an LCR network (equivalent to a quartz crystal) vs. frequency. The component values for this simulation are:

$L = 0.1$ H $C = 0.01$ pF $R = 5$ Ω

These values of inductance and capacitance result in a resonant frequency of $\omega_0 = 31.623 \times 10^6$ radians per second (i.e., 5.0329 MHz). In FIG. 4a, note that in the vicinity of the resonant frequency, the impedance of the LCR network drops sharply, resulting in a dip in the voltage across the network. The abruptness of this drop in impedance is related to the Q of the network; the higher the $Q_1$ the more precipitous the drop in impedance. Because of this characteristic, a high Q LCR network is useful in frequency selective circuits, such as filters and oscillators. In particular, increasing the Q of the resonant network in an oscillator generally leads to a more stabile operating frequency.

Recall from the discussion of the oscillator block diagram in FIG. 1 that the feedback signal must have the proper phase angle (i.e., 2π radians) for oscillation to occur. In practice, the frequency of oscillation may be perturbed by noise and other random influences. As mentioned earlier, these influences may cause a slow drift away from the nominal operating frequency of the oscillator, or may produce transient deviations, known as phase jitter. However, these phenomena are suppressed by a resonant LC network with a high Q. Refer now to FIG. 4b, showing the phase angle of the impedance of the LCR network. Note that the phase angle has an extremely steep slope in the vicinity of the resonant frequency $\omega_0$. This implies that a signal at a slightly different frequency $\omega_0 \pm \Delta\omega$ passing through the network will be subjected to a large phase shift (away from the ideal phase angle of 2π radians), thus rendering it incapable of sustained oscillation.

Figure 5A:
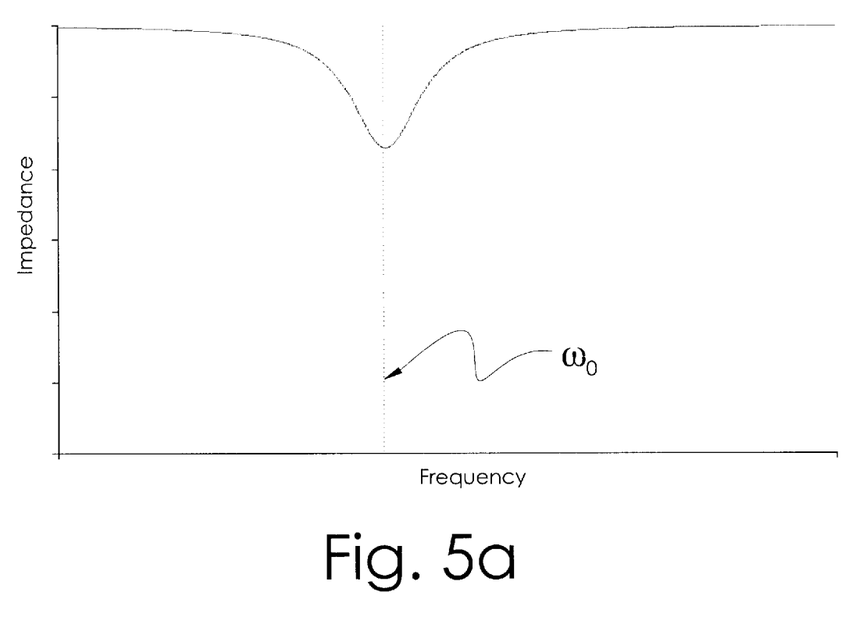
FIG. 5 plots the magnitude and phase of the impedance of a series LCR network with a high intrinsic resistance.
Figure 5B:
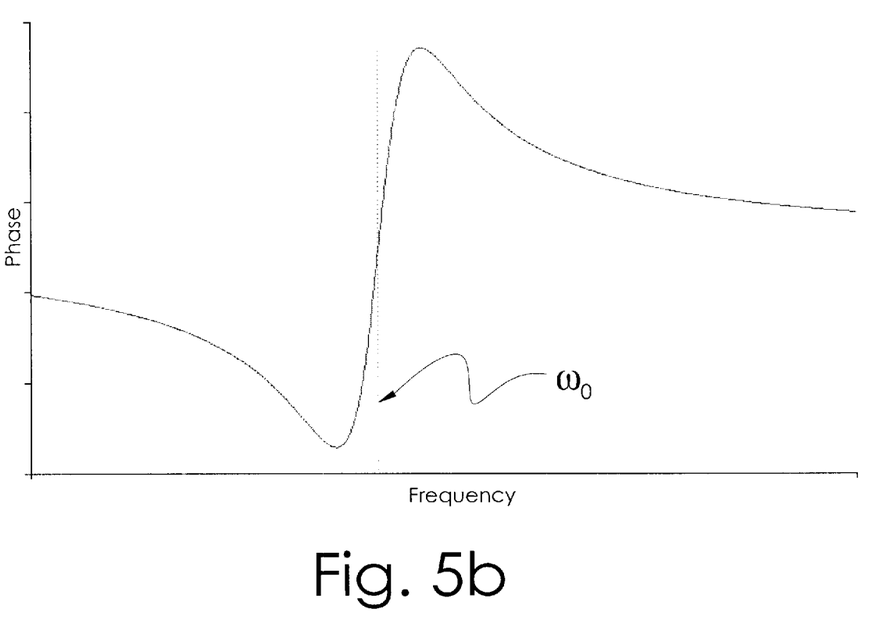

Resistive losses in an LCR network reduce the Q of the network, degrading its frequency selectivity. FIGS. 5a and 5b plot the magnitude and phase of the impedance of an LCR network similar to that in FIGS. 4a and 4b, but with the intrinsic resistance increased from 5Ω to 50Ω. Note that the magnitude at resonance does not decrease as much as in the previous case, and the slope of the phase at $\omega_0$ is also not as sharp. Therefore, the frequency selectivity of the LCR circuit represented in FIGS. 5a and 5b is not as good as that of FIGS. 4a and 4b.

Unfortunately, the most commonly employed crystal oscillator circuits require the use of bias resistors coupled to the crystal. The crystal is typically treated as an inductance, and resonated with a parallel capacitor (such as $C_P$ 12 in FIG. 2b). In this configuration, the intrinsic resistance of the crystal appears transformed as a very high parallel resistance. The presence of the bias resistors reduces this parallel resistance, increasing the energy dissipated and severely degrading the Q of the resonant network.

It would be desirable to have a crystal oscillator circuit that avoids the reduction in Q that results from resistive loading of the crystal. The desired crystal oscillator should maintain proper amplifier biasing without degrading stable, low-noise operation at the resonant frequency. The oscillator should require no modification to operate at various frequencies, other than to change the crystal. Furthermore, the design of the oscillator should be such that it may be readily fabricated upon and within a common substrate, as an integrated circuit.

SUMMARY OF THE INVENTION

The problems outlined above may be addressed by a circuit and method disclosed herein for a crystal oscillator in which the operating point is biased without reducing the Q of the crystal. The circuit oscillates at a frequency defined by a resonant network containing the crystal and other reactive components. The present oscillator may employ an operational transconductance amplifier (OTA), containing bipolar or metal oxide semiconductor (MOS) transistors, to create a negative resistance. The negative resistance compensates for energy losses in the resistance within the resonant network, thereby sustaining oscillation. Other OTAs may be employed as gain and control elements within the oscillator circuit.

Conventional crystal oscillators maintain an operating point by means of bias resistors connected to the resonant network. The resistance of these bias resistors is typically lower than the effective parallel resistance of the crystal. Therefore, the bias resistors load the resonant network, reducing its Q. The Q directly influences the frequency stability and phase jitter of the oscillator, so lowering Q degrades the performance of the oscillator.

In contrast to the conventional approach, the oscillator circuit disclosed herein employs a feedback-controlled current source (i.e., the output of an OTA) to derive the operating point. The current source presents an extremely high impedance, and does not load the resonant network. This allows the resonant network to be operated at a higher Q, relative to conventional oscillator circuits, so oscillator performance is optimized. The OTA coupled to the resonant network employs a combination of positive feedback and negative feedback. Positive feedback is applied only at the desired frequency of oscillation, while negative feedback is applied at other frequencies to stabilize the oscillator.

A method for biasing a crystal oscillator without reducing the Q of the resonant network containing the crystal is also disclosed herein. The present method calls for using a controlled current source to bias the resonant network of the oscillator, instead of the bias resistors used in conventional crystal oscillators. The current source may be the output of an OTA, which appears as a high impedance to the resonant network, and does not degrade the Q through loading effects.

The method further describes the use of an oscillator amplifier as a negative resistance to enable continuous oscillation by compensating for resistive losses in the resonant network. The oscillator amplifier receives both positive and negative feedback. The positive feedback is applied only at the oscillation frequency, while the negative feedback is applied at other frequencies to stabilize the oscillator amplifier.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

As noted above, crystal oscillators are often employed as the clock-based timing circuitry in integrated circuits (ICs). Well-designed crystal oscillators are excellent timing references, since their oscillation frequency is stable over time and with changes in temperature. However, this stability is largely dependent on the Q of the crystal, which may be compromised by the resistive bias network in the oscillator. Resistive loading of the crystal by the bias network decreases the Q, resulting in poorer long-term stability and added phase jitter in the oscillator. Unfortunately, most conventional crystal oscillator circuits require such bias networks.

Figure 6:
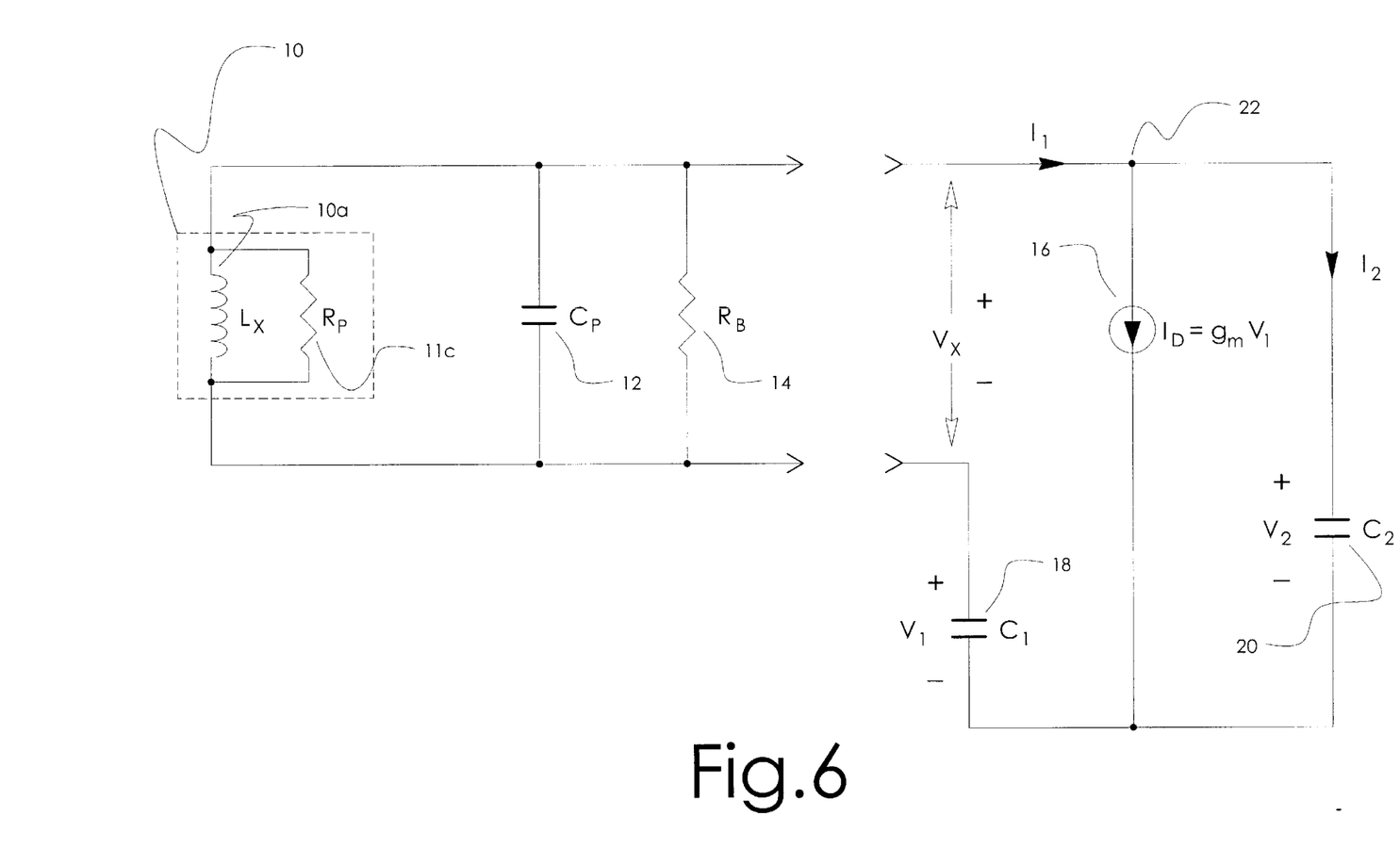
FIG. 6 contains an oscillator circuit in which the crystal is shown in its parallel equivalent form, illustrating the loading effects of the bias resistor.

Referring again to FIG. 2b the purpose of bias resistor $R_B$ 14 is to set the operating point of the transistor $Q_1$ 16. Although this is an important function, the presence of $R_B$ across the crystal $X_1$ 10 constitutes a resistive load. This causes the crystal to lose energy and reduces its Q, which in turn increases both drift and phase jitter in the oscillator. As mentioned earlier, a crystal is typically operated at a frequency at which its inductive reactance is greater than its capacitive reactance—i.e., it appears inductive. Therefore, it is common to resonate the inductive component of the crystal with an external capacitor. In this case, the components of the resonant LCR network are connected in parallel, rather than in series—this arrangement is shown in FIG. 6. Note that, while the impedance of a series LCR circuit reaches its minimum value at resonance, that of a parallel LCR circuit attains its maximum impedance at the resonant frequency.

In FIG. 6, the crystal 10 shown earlier in FIG. 3 is redrawn as an inductor with an equivalent parallel resistance $R_P$ 11c. The parallel capacitor $C_P$ 12 and bias resistor $R_B$ 14 are the same as in FIG. 3. The parallel version of the crystal equivalent circuit shown in FIG. 6 is valid only at the resonant frequency $\omega_0$, and not at all frequencies. In the parallel equivalent form, the inductor $L_X$ 10a has the same value as in the series form shown in FIG. 3. However, the parallel resistance $R_P$ 11c is much larger than the resistance $R_X$ 10c in the series equivalent circuit: $R_P=(Q^2+1)R_X$. This relationship is significant in connection with the loading effects of the bias resistor $R_B$ 14. For example, a crystal may have a Q of 100,000 and an effective series resistance of 5Ω. In an oscillator, the crystal is treated as an inductance and is resonated with a parallel capacitor $C_P$ 12. At the resonant frequency, the series combination of the crystal inductance $L_X$ 10a and series resistance $R_X$ 10c may be replaced by an equivalent parallel network consisting of $L_X$ 10a and $R_P$ 11c (as shown in FIG. 6). But if $R_X$=5Ω and Q=100,000, then $R_P$=500,000Ω. In other words, the crystal appears as an inductor in parallel with a high resistance. The bias resistor $R_B$ 14 is typically not this large, however. Therefore, $R_B$ loads the crystal and reduces its effective Q, with the undesirable consequences discussed above.

In some cases, the bias resistor values can be selected to minimize the loading effect on the crystal. However, these same values would not be optimal if the crystal were subsequently changed to allow the oscillator to operate at a different frequency. This is a significant drawback for oscillator designs intended for integrated circuits. It is beneficial for an integrated circuit designer to have a standard cell—i.e., a generic oscillator module that can be "pasted" into various designs with little modification. Ideally, the designer could reuse the standard cell oscillator in any new IC, by simply substituting the appropriate crystal for the desired operating frequency. However, present crystal oscillator designs force the IC designer to choose between a generic oscillator module with compromised stability and phase jitter characteristics, or creating a custom oscillator module for each new IC.

A circuit and method are disclosed herein for a crystal oscillator in which the operating point is maintained without reducing the Q of the crystal. This is accomplished through the use of a high impedance current source to bias the amplifier in the oscillator, rather than a passive bias resistor network.

Figure 7A:
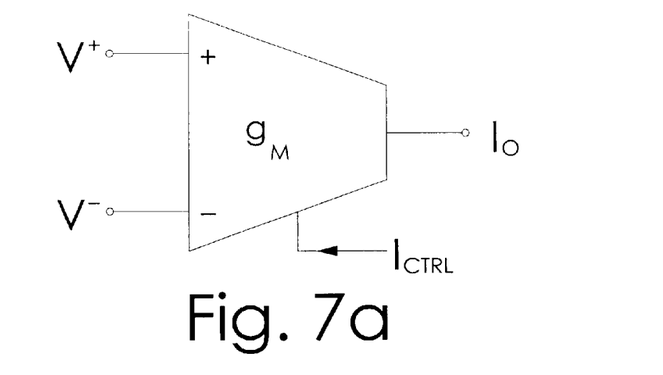
FIGS. 7a, 7b and 7c illustrate the structure of an operational transconductance amplifier (OTA), and the use of an OTA to create a negative resistance.

As discussed earlier, a crystal oscillator can be modeled as a resonant LCR network coupled to a negative resistance. A negative resistance can be derived through the application of positive feedback in a transconductance amplifier. A transconductance amplifier transforms an input voltage into an output current, according to the relationship:

$$g_m = I_{out}/V_{in}$$

where $g_m$ is the transconductance (in siemens, or amps per volt), and represents the gain of the transconductance amplifier. Transconductance amplifiers are widely employed in oscillators, filters and other analog circuitry, commonly implemented as operational transconductance amplifiers (OTA). The standard schematic symbol for an OTA is shown in FIG. 7a. The OTA receives a differential input voltage (i.e., $V^+ - V^-$) and produces an output current $I_O$. It is reminiscent of the familiar schematic symbol for a traditional operational amplifier, which produces an output voltage in response to a differential voltage input. In addition to the inverting and non-inverting signal inputs, an input for a control current $I_{CTRL}$ is often provided in an OTA. The magnitude of the OTA transconductance $g_m$ is a function of $I_{CTRL}$. Consequently, by varying $I_{CTRL}$ it is possible to control the gain of the OTA.

Figure 7B:
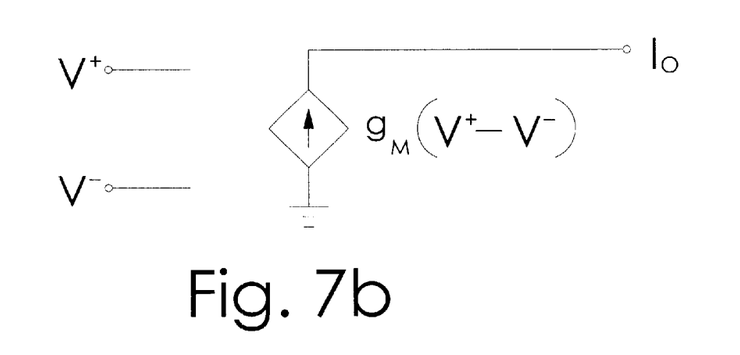
Figure 7C:
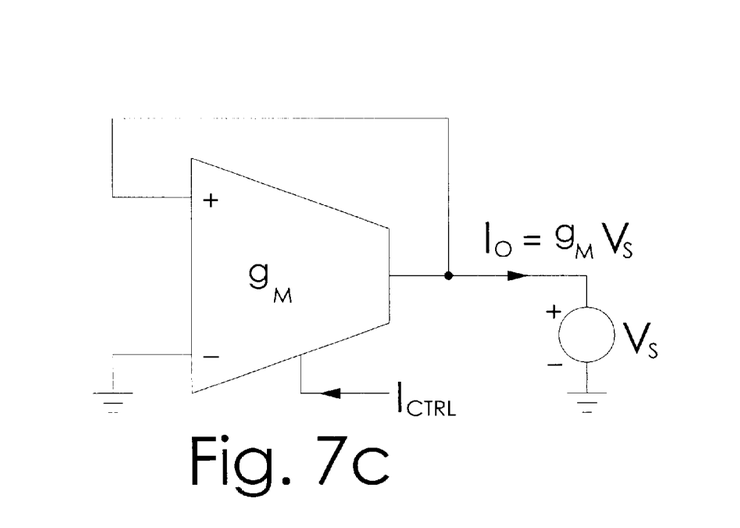

An ideal OTA is represented as a voltage-controlled current source, as shown in FIG. 7b. The output current 10 is the product of the transconductance $g_m$ and the difference between the voltage at the non-inverting input $V^+$ and the voltage at the inverting input $V^-$. It can be shown that, if positive feedback is applied around the OTA as shown in FIG. 7c, the OTA appears as a negative resistance to a voltage source $V_S$ connected to its output. Each input of the OTA is a high impedance, into which current flow is negligible. Consequently, current can only flow between the output of the OTA and the source $V_S$. The voltage at the non-inverting input of the OTA may therefore be assumed to be $V_S$. This implies that the OTA output current $I_O = g_m \times V_S$. Therefore, when the source is connected to the OTA as shown in FIG. 7c, it receives a proportional current. Since the current is proportional, the OTA appears resistive; and because the current flows into (rather than out of) the source $V_S$, the resistance is negative.

Figure 8:
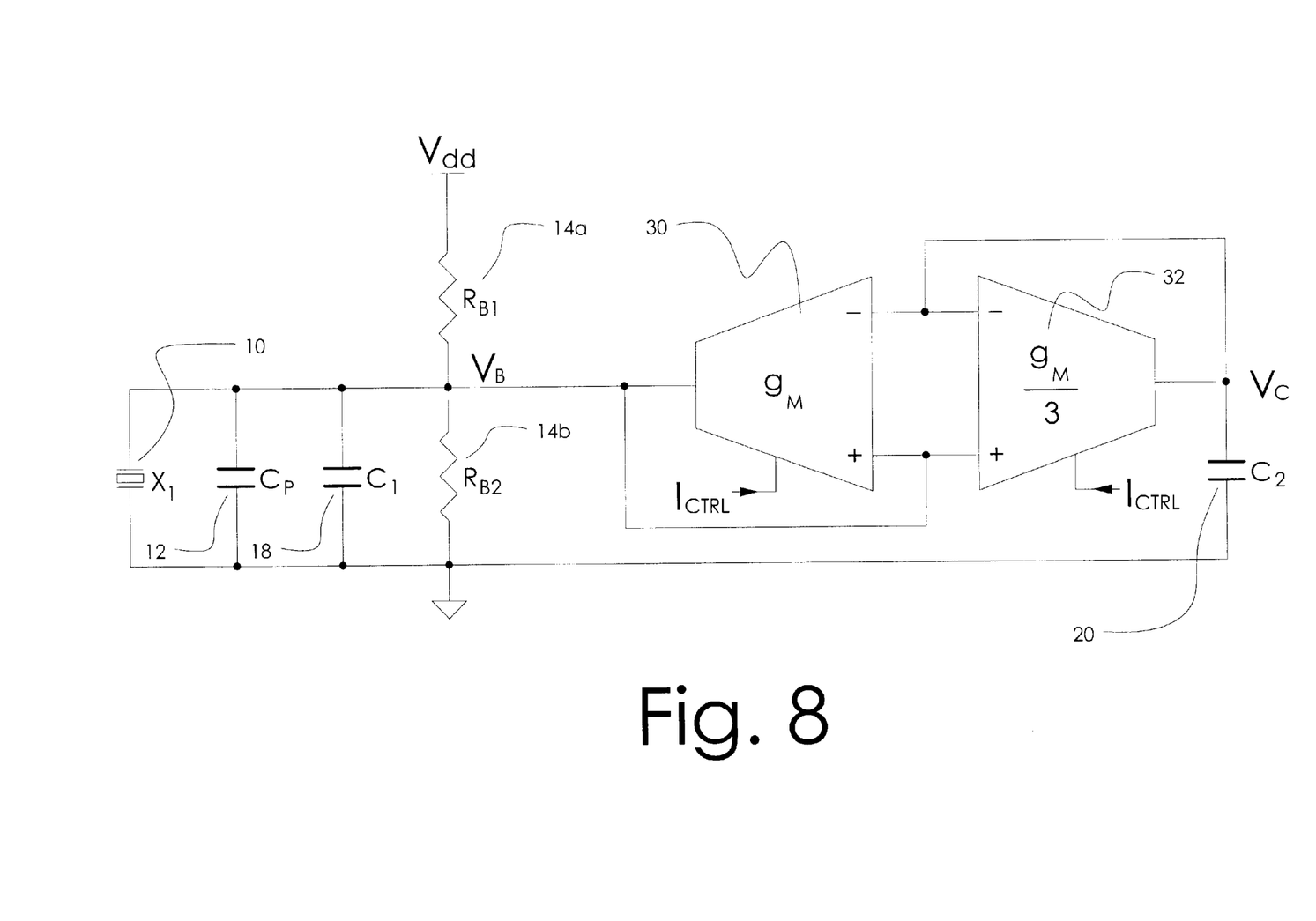
FIG. 8 represents a crystal oscillator design.

As discussed earlier, a negative resistance can be utilized to overcome resistive losses in the non-ideal components in an oscillator. FIG. 8 shows how two OTAs can be employed in a crystal oscillator. A crystal $X_1$ 10, in parallel with capacitors $C_P$ 12 and $C_1$ 18, is connected to the output of an OTA 30. The OTA 30 receives positive feedback, to form a negative resistance as described above. An appropriate value of $g_m$ for the OTA 30 results in a negative resistance that compensates for energy lost in the intrinsic resistance of the crystal $X_1$ 10, permitting continuous oscillation. A resistive network $R_{B1}$ 14a and $R_{B2}$ 14b biases the crystal at an optimum DC operating voltage $V_B$ (typically, $V_B = V_{dd}/2$).

Note that the non-inverting input of OTA 32 is connected to the output of OTA 30. Furthermore, the inverting input of both OTA 30 and OTA 32 is connected directly to the output of OTA 32. At frequencies other than the resonant frequency of $X_1$ 10, the voltage at the non-inverting input of OTA 30 is proportional to $$\frac{g_m}{C_P + C_1},$$

and the voltage at the inverting input is proportional to $$\frac{g_m}{3 \cdot C_2}.$$

The voltage at the non-inverting input of OTA 30 constitutes positive feedback, and the voltage at the inverting input constitutes negative feedback via OTA 32. Oscillation cannot occur when the amount of negative feedback is greater than the amount of positive feedback:

$$\frac{g_m}{3 \cdot C_2} > \frac{g_m}{C_P + C_1}$$

At the resonant frequency $\omega_0$, the resonant network consisting of the inductive reactance of crystal $X_1$ 10 in parallel with capacitor $C_P$ 12 becomes a high impedance, causing the voltage at the non-inverting input of OTA 30 to increase dramatically. Thus, positive feedback exceeds negative feedback only at the resonant frequency, allowing continuous oscillation.

The performance of the circuit shown in FIG. 8 is less than optimal with regard to frequency stability and phase jitter. This is attributable to loading of the resonant network ($X_1$ 10 and $C_P$ 12) by the bias resistors $R_{B1}$ 14a and $R_{B2}$ 14b. Resistive loading reduces the Q of the resonant network, degrading the inherent frequency selectivity of the crystal.

Figure 9:
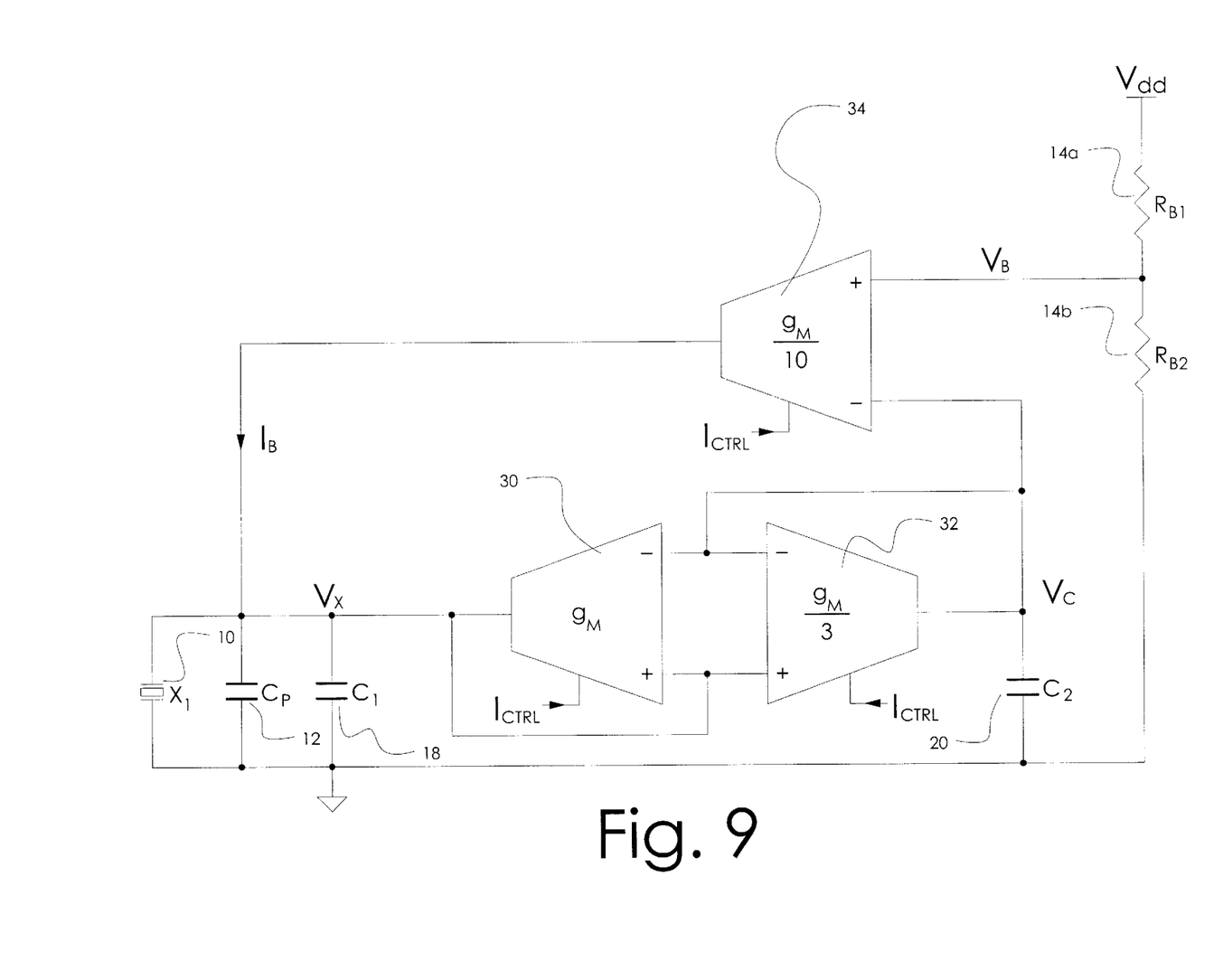
FIG. 9 illustrates a crystal oscillator embodying the present circuit and method.

A crystal oscillator circuit embodying the circuit and method disclosed herein appears in FIG. 9. The oscillator incorporates a third OTA 34 to supply a bias current $I_B$ into the resonant network $X_1$ 10 and $C_P$ 12. OTA 34 receives the bias voltage $V_B$ from the junction of bias resistors $R_{B1}$ 14a and $R_{B2}$ 14b, and negative feedback in the form of voltage $V_C$ generated by OTA 32. This combination of signals enables OTA 34 to adjust the bias current $I_B$ as needed to bring the average voltage $V_X$ to the desired operating point.

Since the output of an OTA is a current source, the OTA has a high output impedance. As mentioned earlier, both inputs of an OTA are also high impedances. Hence, the resonant network is not loaded by the output of OTA 30 or OTA 34, nor by the input of OTA 30 and OTA 32. Since there are no resistive components to load $X_1$ and $C_P$, the Q of the resonant network can be significantly higher than in the circuit of FIG. 8. Furthermore, since the bias point is controlled by feedback, the circuit shown in FIG. 9 can accommodate crystals covering a wide range of operating frequencies. This is renders the circuit suitable for use as a "universal oscillator" standard cell in new integrated circuit designs. In contrast, the conventional circuit of FIG. 8 would require different values of $R_{B1}$ and $R_{B2}$ when changing from one crystal to another with a much higher or lower frequency.

As mentioned earlier, OTAs are often equipped with a control current that can be used to vary the transconductance gain $g_m$ of the OTA. A particularly useful application of the control current is for amplitude regulation, or automatic gain control (AGC). In addition to satisfying the gain and phase requirements for oscillation, an oscillator must generally also include a means for regulating the amplitude of the oscillatory waveform. Referring again to FIG. 1, note that once oscillation is established, the feedback waveform 60 continues to reinforce the waveform 56 at the input to the amplifier 50. This implies that the signal leaving the summing junction 54 will continue to become larger and larger. Eventually, the amplitude of the signal will be constrained by the power supply voltage, or other device limits. However, this form of limiting is usually undesirable, since it results in distortion and component stress. In some cases, the excessive signal swings can induce non-linear behavior in the amplifier, sometimes manifesting itself as an effective resistance across the resonant network (thus, reducing the Q). In the present embodiment of the circuit and method disclosed herein, an AGC circuit monitors the amplitude of the oscillator output signal, and uses the control current to adjust the $g_m$ of the OTAs to constrain the signal level to the desired range. Note that the ratio of $g_m$ in the OTAs is preserved during AGC operation. Thus, for example, the transconductance of OTA 34 is always 10% of the transconductance of OTA 30, as the AGC increases or decreases $g_m$. Advantageously, because the OTAs have a current source output, they retain their high output impedance even if their $g_m$ is reduced by the action of the AGC circuit.

It will be appreciated by those skilled in the art having the benefit of this disclosure that the embodiments described are believed applicable to the design of a crystal oscillator have been presented. According to the circuit and method disclosed herein, the oscillator frequency is determined by a resonant circuit containing a crystal. Furthermore, the Q of the resonant circuit is substantially unimpaired by resistive loading. A high Q is known to be beneficial to the frequency stability and absence of phase jitter in an oscillator. Furthermore, the present circuit and method permit the oscillator to operate with crystals over a wide range of frequencies, without requiring significant changes to the circuit. The circuit and method disclosed herein are well suited for use in integrated circuits. Although illustrated with reference to MOSFET transistors, the circuit and method disclosed herein may be adapted to use other types of field effect or bipolar transistors. Accordingly, the specification and drawings are to be regarded in an illustrative rather than a restrictive sense as to possibly numerous architectures, circuitry, and methodologies which fall within the spirit and scope of the present invention.

What is claimed is:

1. An oscillator circuit, comprising:
   a resonant circuit;
   an amplifier operably coupled to the resonant circuit and adapted to oscillate at a frequency determined by the resonant circuit, wherein the amplifier appears as a negative resistance to the resonant circuit, such that the magnitude of the negative resistance is greater than that of a resistance associated with the resonant circuit;
   a current source adapted to provide a bias current to the resonant circuit for maintaining a consistent voltage swing across the resonant circuit without any substantial reduction in the quality factor (Q) of the resonant circuit; and
   wherein the voltage swing is proportional about a power supply voltage divided by two, independent of any load applied to the resonant circuit.

2. The oscillator circuit as recited in claim 1, wherein the voltage swing is within a range between the power supply voltage and ground, independent of any load applied to the resonant circuit.

3. An oscillator circuit, comprising:
   a resonant circuit;
   an amplifier operably coupled to the resonant circuit and adapted to oscillate at a frequency determined by the resonant circuit, wherein the amplifier appears as a negative resistance to the resonant circuit, such that the magnitude of the negative resistance is greater than that of a resistance associated with the resonant circuit;
   a current source adapted to provide a bias current to the resonant circuit for maintaining a consistent voltage swing across the resonant circuit without any substantial reduction in the quality factor (Q) of the resonant circuit; and
   wherein the current source is produced from a transconductance amplifier, that employs feedback to maintain the resonant circuit at an operating point determined by a reference voltage applied to an input of the transconductance amplifier.

4. An oscillator circuit, comprising:
   a resonant circuit;
   an amplifier operably coupled to the resonant circuit and adapted to oscillate at a frequency determined by the resonant circuit, wherein the amplifier appears as a negative resistance to the resonant circuit, such that the magnitude of the negative resistance is greater than that of a resistance associated with the resonant circuit;
   a current source adapted to provide a bias current to the resonant circuit for maintaining a consistent voltage swing across the resonant circuit without any substantial reduction in the quality factor (Q) of the resonant circuit; and
   further comprising an automatic gain control circuit that varies the gain of the amplifier to regulate an amplitude of an output signal generated by the oscillator circuit.

5. An oscillator circuit, comprising:
   a resonant circuit;
   an amplifier operably coupled to the resonant circuit and adapted to oscillate at a frequency determined by the resonant circuit, wherein the amplifier appears as a negative resistance to the resonant circuit, such that the magnitude of the negative resistance is greater than that of a resistance associated with the resonant circuit;
   a current source adapted to provide a bias current to the resonant circuit for maintaining a consistent voltage swing across the resonant circuit without any substantial reduction in the quality factor (Q) of the resonant circuit; and
   wherein the amplifier receives positive feedback at the frequency determined by the resonant circuit and negative feedback at all other frequencies.

6. A method for producing an oscillating signal, comprising:
   initiating oscillation of an oscillator at a frequency determined by a resonant circuit coupled to the oscillator, wherein the oscillator comprises an oscillator amplifier;
   applying positive feedback to the oscillator amplifier at the frequency determined by the resonant circuit, and applying negative feedback at all other frequencies; and
   inputting a bias current from a current source to the resonant circuit while maintaining a consistent voltage swing across the resonant circuit, without any substantial reduction in the quality factor (Q) of the resonant circuit.

7. The method as recited in claim 6, further comprising outputting the oscillating signal from the oscillator to a load.

8. The method as recited in claim 6, further comprising using a transconductance amplifier as the oscillator amplifier.

9. The method as recited in claim 8, wherein the transconductance amplifier comprises a semiconductor device with a voltage-to-current transfer characteristic, such as an operational transconductance amplifier (OTA), or metal oxide semiconductor field effect transistor (MOSFET).

10. The method as recited in claim 8, further comprising supplying a control current to the oscillator amplifier for controlling a transconductance of the oscillator.

11. The method as recited in claim 10, wherein controlling the transconductance of the oscillator comprises adjusting output from an automatic gain control (AGC) circuit to regulate the amplitude of the oscillating signal.

12. The method as recited in claim 6, further comprising using a transconductance amplifier as the current source to define the voltage swing about a reference voltage supplied to the transconductance amplifier, and employing negative feedback within the transconductance amplifier to maintain the voltage swing about the reference voltage independent of a load coupled to the resonant circuit.

13. The method as recited in claim 6, further comprising using the oscillator amplifier to couple a negative resistance to the resonant circuit, such that a magnitude of the negative resistance is greater than that of a resistance associated with the resonant circuit.

* * * * *